US009129940B2

(12) United States Patent
Hsieh et al.

(10) Patent No.: US 9,129,940 B2
(45) Date of Patent: Sep. 8, 2015

(54) RF CALIBRATION THROUGH-CHIP INDUCTIVE COUPLING

(75) Inventors: Hsieh-Hung Hsieh, Taipei (TW); Yi-Hsuan Liu, Hualien County (TW); Tzu-Jin Yeh, Hsinchu (TW); Chewn-Pu Jou, Hsinchu (TW); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 688 days.

(21) Appl. No.: 13/419,911

(22) Filed: Mar. 14, 2012

(65) Prior Publication Data

US 2013/0241634 A1   Sep. 19, 2013

(51) Int. Cl.
*G01R 35/00* (2006.01)
*H01L 23/48* (2006.01)
*H01L 23/66* (2006.01)
*H01L 25/065* (2006.01)
*H04B 5/00* (2006.01)

(52) U.S. Cl.
CPC ............... *H01L 23/48* (2013.01); *H01L 23/66* (2013.01); *H01L 25/0657* (2013.01); *H01L 2225/06531* (2013.01); *H01L 2924/0002* (2013.01); *H04B 5/0075* (2013.01)

(58) Field of Classification Search
CPC ... H03F 1/565; H03F 2200/294; H03F 3/189; H03F 2200/451

USPC .......................................................... 324/601
See application file for complete search history.

(56) References Cited

U.S. PATENT DOCUMENTS

| 2003/0218514 A1* | 11/2003 | Eckl et al. ....................... 333/32 |
| 2009/0051441 A1* | 2/2009 | Branch et al. ................. 330/305 |
| 2010/0259319 A1* | 10/2010 | Chan et al. ..................... 327/563 |
| 2011/0050336 A1* | 3/2011 | Lu et al. ......................... 329/347 |

OTHER PUBLICATIONS

Mizoguchi, D., et al., "A 1.2Gb/s/pin Wireless Superconnect Based on Inductive Inter-Chip Signaling (IIS)", ISSCC 2004,/Session 7/TD: Scaling Trends/7.6.

* cited by examiner

*Primary Examiner* — Melissa Koval
*Assistant Examiner* — Daniel Miller
(74) *Attorney, Agent, or Firm* — Duane Morris LLP

(57) ABSTRACT

An integrated circuit includes a first chip and a second chip coupled to the first chip in a vertical stack. The first chip includes a radio frequency circuit and a first coil electrically coupled to the radio frequency circuit. The second chip includes a calibration circuit and a second coil electrically coupled to the calibration circuit. The calibration circuit is configured to calibrate the radio frequency circuit disposed on the first chip through inductive coupling between the first and second coils.

21 Claims, 8 Drawing Sheets

RF CALIBRATION THROUGH-CHIP INDUCTIVE COUPLING

FIELD OF DISCLOSURE

The disclosed system and method relate to integrated circuits. More specifically, the disclosed system and method relate to calibration circuits and testing methods for integrated circuits.

BACKGROUND

The 60 GHz radio spectrum is currently unlicensed in many countries around the world and enables high-data rate communication between devices. For example, 60 Hz radio enables two devices to perform a gigabit file transfer in less than one minute. However, conventional 60 GHz radio designs are extremely sensitive to process variations, which leads to improperly functioning devices.

DETAILED DESCRIPTION

This description of the exemplary embodiments is intended to be read in connection with the accompanying drawings, which are to be considered part of the entire written description.

The disclosed integrated circuit ("IC") includes a radio frequency ("RF") circuit that is inductively coupled to a calibration circuit. The inductive coupling between the RF circuit and calibration circuit enables compensation for process variation, which improves the function of the RF circuit. The calibration circuit may advantageously be disposed on the same integrated circuit chip on which the RF circuit is disposed while providing non-contact calibration with reduced fabrication cost.

Figure 1:
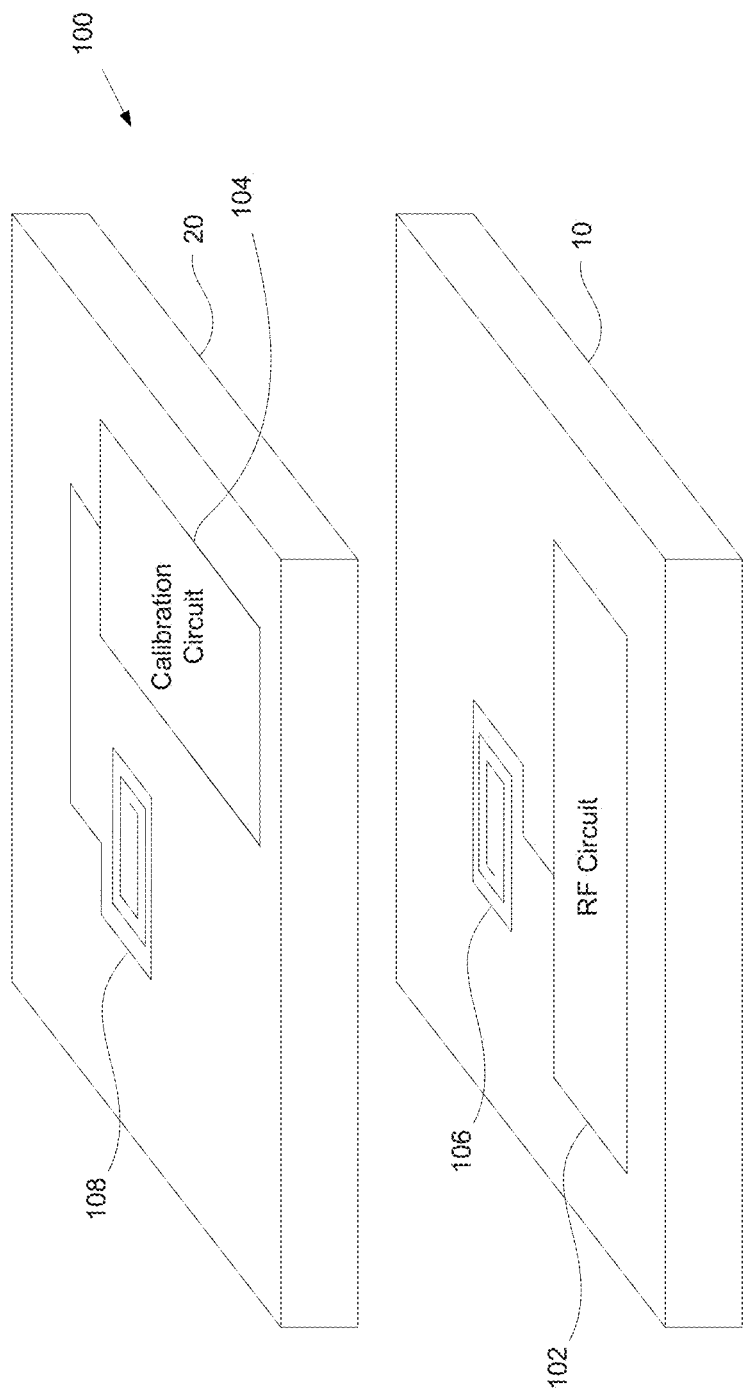
FIG. 1 illustrates one example of an improved integrated circuit including an RF circuit disposed on a first chip that is inductively coupled to a calibration circuit disposed on a second chip.

FIG. 1 illustrates a block diagram of one example of an improved integrated circuit ("IC") 100 including an RF circuit 102 disposed on a first chip 10 that is inductively coupled to a calibration circuit 104 disposed on a second chip 20 that is disposed on and coupled to the first chip 10. Each of the RF circuit 102 and calibration circuit 104 is electrically coupled to a respective coil 106, 108 for inductively coupling RF circuit 102 to calibration circuit 104. IC 100 may include a plurality of vertically stacked chips commonly referred to as a three-dimensional ("3D") IC.

Figure 2A:
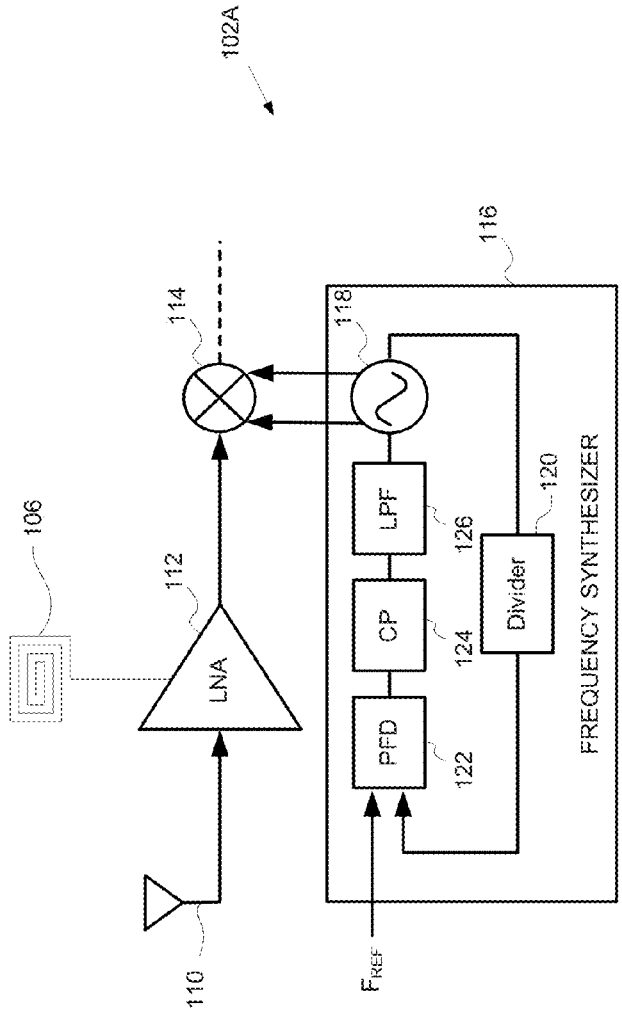
FIG. 2A illustrates one example of an RF circuit in accordance with the improved integrated circuit illustrated in FIG. 1.

In some embodiments, RF circuit 102 is an RF receiver circuit. FIG. 2A is a block diagram of one example of an RF receiver circuit 102A in accordance with the IC 100 illustrated in FIG. 1. As shown in FIG. 2A, RF circuit 102A includes an antenna 110 configured to receive an oscillating input signal having a carrier frequency. RF receiver circuit 102A also includes a low noise amplifier ("LNA") 112, a mixer circuit 114, and a frequency synthesizer 116. Frequency synthesizer 116 includes a voltage controlled oscillator ("VCO") 118, a divider circuit 120, a phase frequency detector ("PFD") 122, a charge pump ("CP") 124, and a low pass filter ("LPF") 126. Coil 106 may be electrically coupled to LNA 112 as illustrated in FIG. 2A, although one of ordinary skill in the art will understand that coil 106 may be electrically coupled to other circuits of the RF receiver circuit 102A.

Figure 2B:
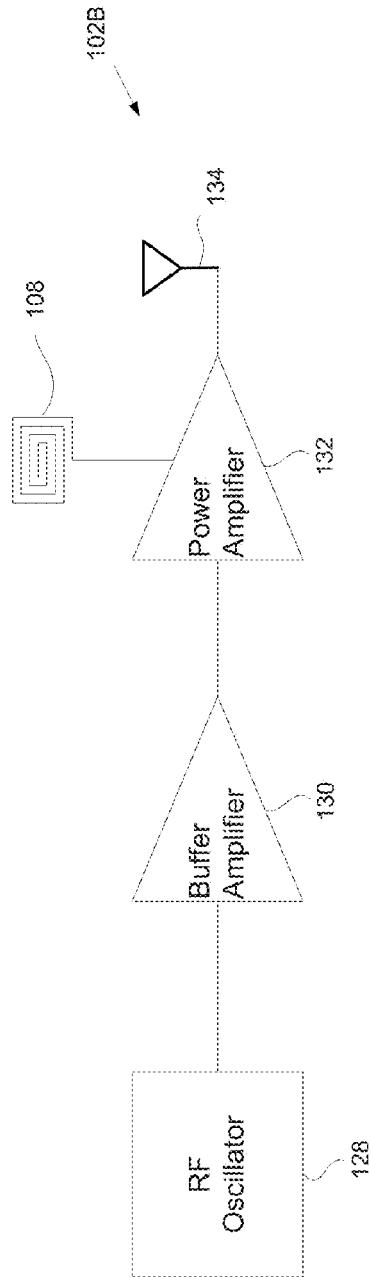
FIG. 2B illustrates another example of an RF circuit in accordance with the improved integrated circuit illustrated in FIG. 1.

In some embodiments, RF circuit 102 is an RF transmitter circuit. FIG. 2B is a block diagram of one example of an RF transmitter circuit 102B in accordance with the IC 100 illustrated in FIG. 1. As shown in FIG. 2B, RF transmitter 102B includes an RF oscillator 128, a buffer amplifier 130, and a power amplifier 132. Power amplifier 132 is electrically coupled to coil 108 and has its output coupled to a transmitting antenna 134. One of ordinary skill in the art will understand that coil 108 may be electrically coupled to other circuits of the RF transmitter circuit 102B in addition or alternatively to the power amplifier 132.

Figure 3A:
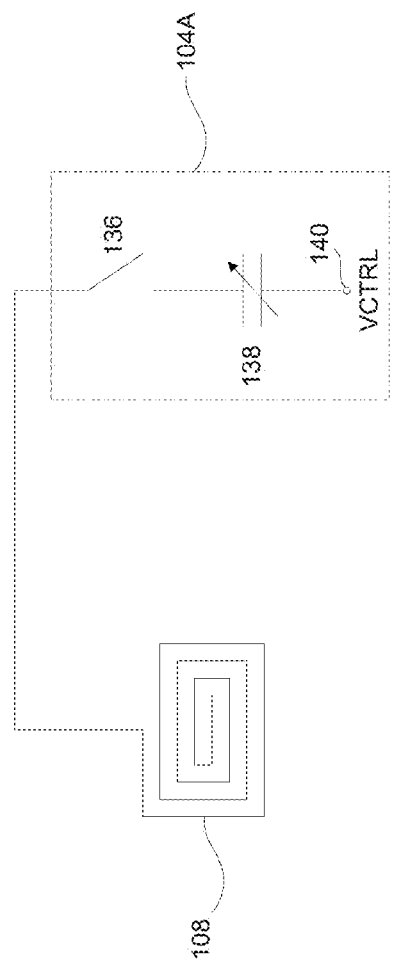
FIGS. 3A and 3B illustrate embodiments of calibration circuits in accordance with the integrated circuit illustrated in FIG. 1.

FIG. 3A illustrates one example of a calibration circuit 104A including a switch 136 and a varactor 138. Switch 136, which may be implemented as a transistor, selectively couples varactor 138 to coil 108 in response to a control signal. Varactor 138 is also coupled to node 140, which is configured to supply a control voltage, VCTRL, to varactor 138 for calibrating the RF circuit 102 through coil 108.

Figure 3B:
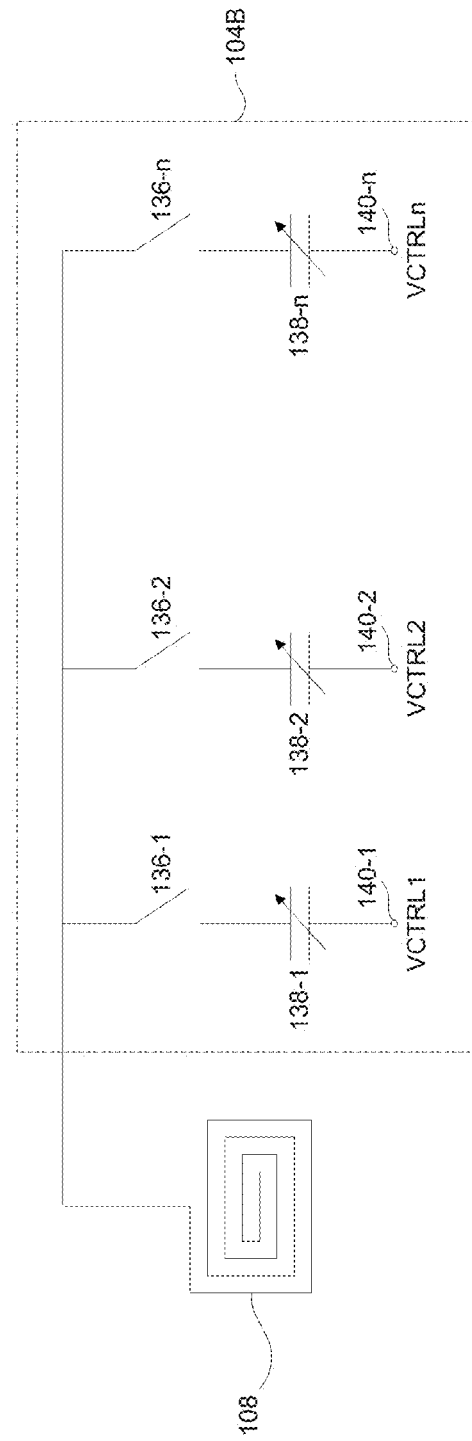

In some embodiments, such as the embodiment of calibration circuit 104B illustrated in FIG. 3B, the calibration circuit 104B may include a plurality of switches 136 and varactors 138 coupled in parallel. The number, n, of switches 136 and varactors 138 may be varied to provide for fine tune calibration as each varactor 138 may be coupled to a different control voltage. For example and as illustrated in FIG. 3B, varactor 138-1 is coupled to switch 136-1 and to control voltage VCTRL1. Varactor 138-2 is coupled to switch 136-2, which selective couples varactor 138-2 to coil 108, and to control voltage VTRL2. Varactor 138-n is coupled to switch 138-n, which selectively couples varactor 138-n to coil 108, and to control voltage VCTRLn.

Figure 4:
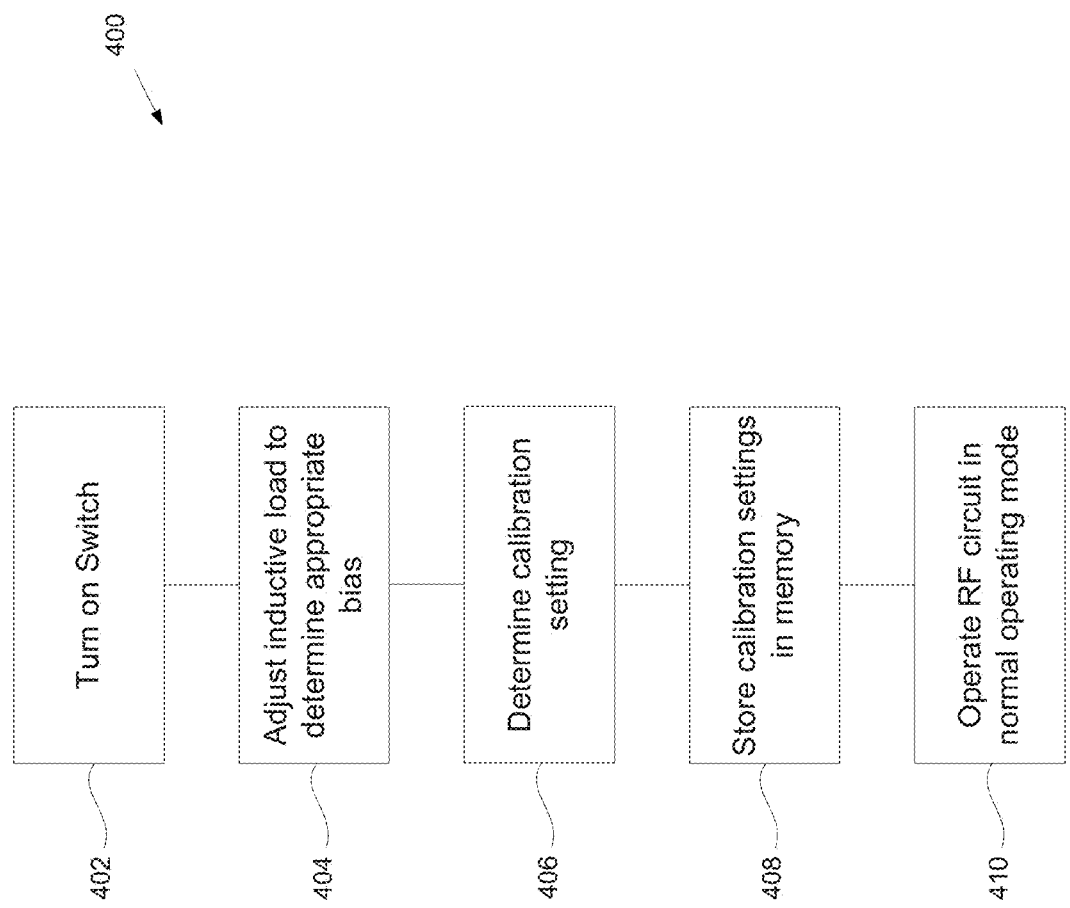
FIG. 4 is a flow diagram of one example of a method of calibrating an integrated circuit in accordance with the integrated circuit illustrated in FIG. 1.

A method of calibrating an RF circuit using a calibration circuit 104 is described with reference to FIG. 4, which is one example of a flow diagram of a calibration method 400. At block 402, switch 136 (or switches 136 in FIG. 3B) is closed such that varactor 138 (or varactors 138 in FIG. 3B) is coupled to coil 108. In some embodiments, switch 136 is a metal oxide semiconductor ("MOS") transistor or a microelectromechanical ("MEMS") switch configured to couple varactor 138 to coil 108 in response to a control signal.

At block 404, the inductive load to the RF circuit 102 is adjusted. In some embodiments, such as the embodiment illustrated in FIG. 3A, the inductive load is adjusted by sweeping the control voltage, VCTRL, over a range of voltages. For example, the control voltage, VCTRL, may be increased from 0 VDC to 1 VDC with switch 136 closed to vary the inductive load that is coupled to coil 106 of RF circuit 102. In some embodiments, such as the embodiment illustrated in FIG. 3B, each of the n switches 136 may be closed at different times to couple the different inductive loads, which are generated by varactors 138 and their respective control voltages, e.g., VCTRL1, VCTRL2, . . . , VCTRLn.

At block 406, the calibration settings are selected. The selection of the calibration settings may be based on the response of the RF circuit 102 when providing a calibration condition may be selected based on the response of the RF circuit 102 when inductively coupled to calibration circuit 104. For example, an oscillating input signal, RFin, may be provided by a test instrument (not shown) while the output signal, RFout, is also monitored. As the inductive load provided by calibration circuit 104 changes (due to changing of VCTRL), the response of the RF circuit 102 will change. In some embodiments, the calibration settings that are selected are the calibration settings (e.g., inductive load and VCTRL values) when the RF circuit 102 has a maximum output, e.g., gain. However, one of ordinary skill in the art will understand that the calibration settings may be selected based on other criteria such as the gain performance.

At block 408, the calibration settings are stored in a memory such as, for example, a read only memory ("ROM"), a random access memory ("RAM"), a flash memory, or other memory as will be understood by an ordinarily skilled person in the art. The calibration settings may include the control voltage, VCTRL, which causes the calibration circuit 104 to provide the desired inductive load to RF circuit 102. The memory may be disposed on the same chip as calibration circuit 104, the same chip as RF circuit 102, or another chip of the IC 100.

At block 410, the RF circuit 102 is operated in a normal operating, e.g., non-testing, mode. In the normal operating mode, calibration circuit 104 provides RF circuit 102 with the calibration settings that were selected at block 406 and stored at block 408.

Figure 5:
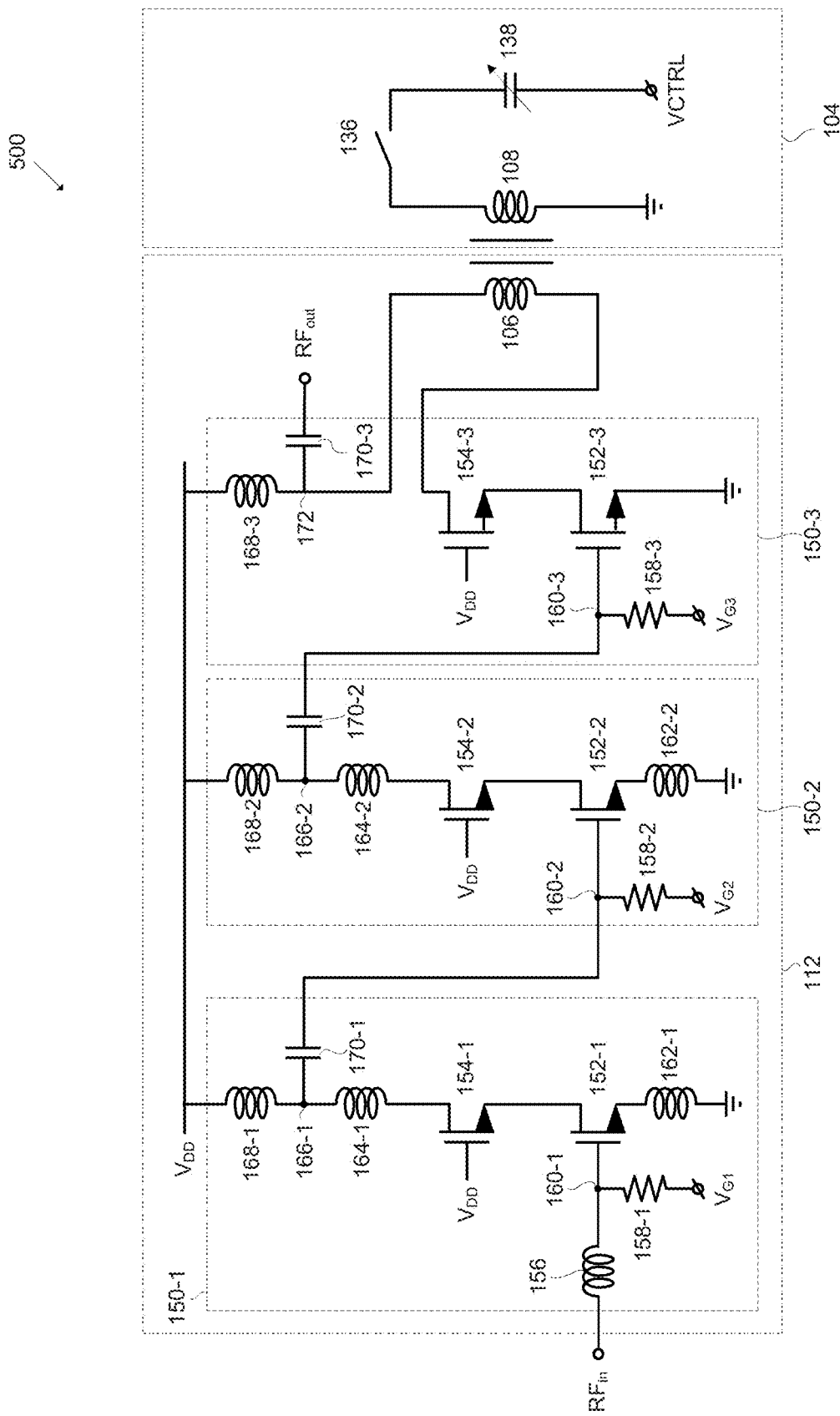
FIG. 5 is a schematic of one example of an integrated circuit that was designed and simulated.

Various integrated circuits have been designed and simulated. FIG. 5 illustrates one such example of an IC 500 that was designed and simulated. IC 500 includes an LNA 112 that is inductively coupled to a calibration circuit 104. LNA 112 includes three stages 150-1, 150-2, and 150-3 with each stage including first and second transistors 152, 154. Referring first to the first stage 150-1, transistor 152-1 has its gate coupled to receive the RF input signal, RFin, through an inductor 156. A biasing resistor 158-1 is coupled to node 160-1, which is disposed between inductor 156 and the gate of transistor 152-1, and to a bias voltage, $V_{G1}$. The source of transistor 152-1 is coupled to ground through an inductor 162-1. Transistor 154-1 has its source coupled to the drain of transistor 152-1, its gate coupled to a node set at $V_{DD}$, and a drain coupled to an inductor 164-1. Inductor 164-1 is coupled to node 166-1 to which inductor 168-1 and capacitor 170-1 are coupled.

Capacitor 170-1 is coupled to node 160-2, which serves as the input of stage 150-2. Biasing resistor 158-2 is coupled to node 160-2 and to bias voltage, $V_{G2}$. The gate of common source transistor 152-2 is also coupled to node 160-2 such that the output of the first stage 150-1 is received at the gate of transistor 152-2. The drain of transistor 152-2 is coupled to the source of transistor 154-2, which has its gate coupled to receive $V_{DD}$. The drain of transistor 154-2 is coupled to inductor 164-2, which is also coupled to node 166-2. Node 166-2 is coupled to $V_{DD}$ through inductor 168-2 and to the third stage 150-3 through capacitor 170-2.

Capacitor 170-2 is coupled to node 160-3, which serves as the input node to stage 150-3. Node 160-3 is also coupled to a bias voltage, $V_{G3}$, through a bias resistor 158-3. The gate of common-source transistor 152-3 is also coupled to node 160-3 such that the output of the second stage 150-2 is received at the gate of transistor 152-3. The drain of transistor 152-3 is coupled to the source of transistor 154-3, which has its gate coupled to $V_{DD}$ and its drain coupled to node 172 through coil 106. Node 172 is coupled to inductor 168-3 and capacitor 170-3 that provides the output signal, RFout.

Coil 106 is inductively coupled to coil 108 of calibration circuit 104, which is disposed on a different chip than LNA 112. Coil 108 is coupled to ground and to switch 136, which is also coupled to varactor 138. Varactor 138 is coupled to control voltage, VCTRL, which may provide a range of DC voltages to varactor 138 as described above.

Figure 6A:
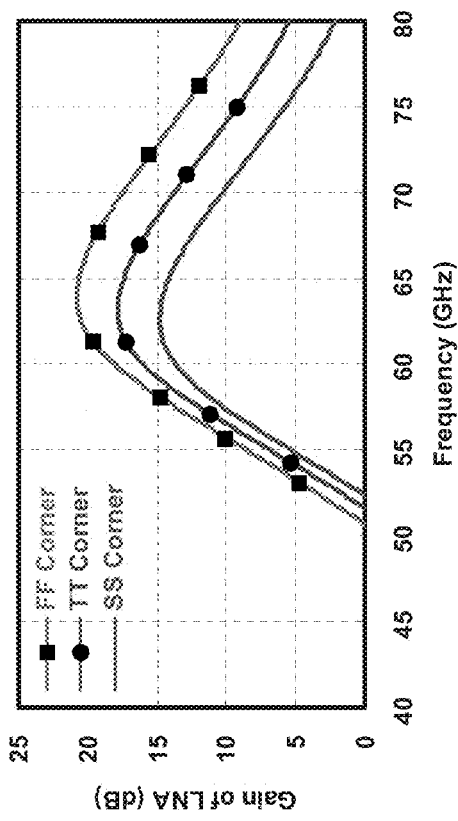
FIG. 6A is a gain versus frequency graph of an uncalibrated RF circuit in accordance with FIG. 5 for different process corners.

FIG. 6A is a gain versus frequency graph of a three-stage LNA, which has not been calibrated using a calibration circuit that is inductively coupled to the LNA, over different processing corners. As shown in FIG. 6A, the gain of the LNA may vary by approximately 5 dB between the fast-fast ("FF") corner and slow-slow ("SS") corner for frequencies greater than 60 GHz. The gain in the typical-typical ("TT") corner is between the FF and SS corners.

Figure 6B:
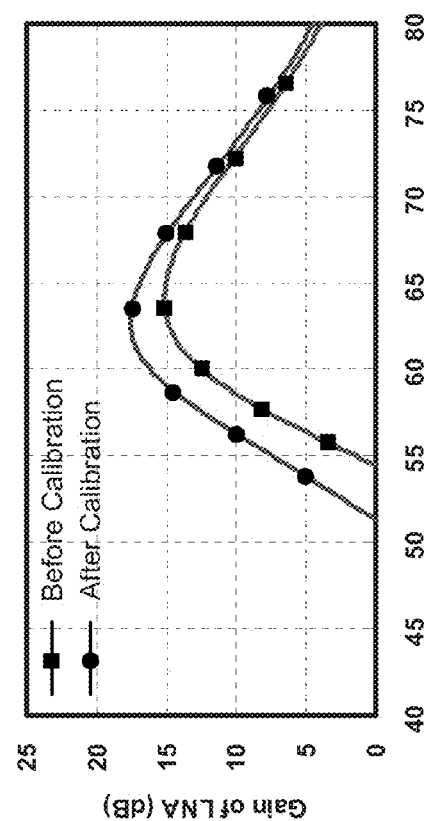
FIG. 6B is a gain versus frequency graph of a calibrated and uncalibrated RF circuit in accordance with FIG. 5.

FIG. 6B is also a gain versus frequency graph for a three-stage LNA, but compares the gain of the LNA prior to calibration to the gain of the LNA after calibration. As shown in FIG. 6B, the maximum gain of the LNA may be correlated under process variations. The simulation data in FIGS. 6A and 6B were obtained by simulating IC 500 illustrated in FIG. 5 in which transistors 152-1 and 154-1 had widths of 44 µm and lengths of 60 nm, transistors 152-2, 154-2, 152-3, and 154-3 had widths of 28 µm and lengths of 60 nm, and coils 106 and 108 were half-turn spiral inductors.

Figure 7:
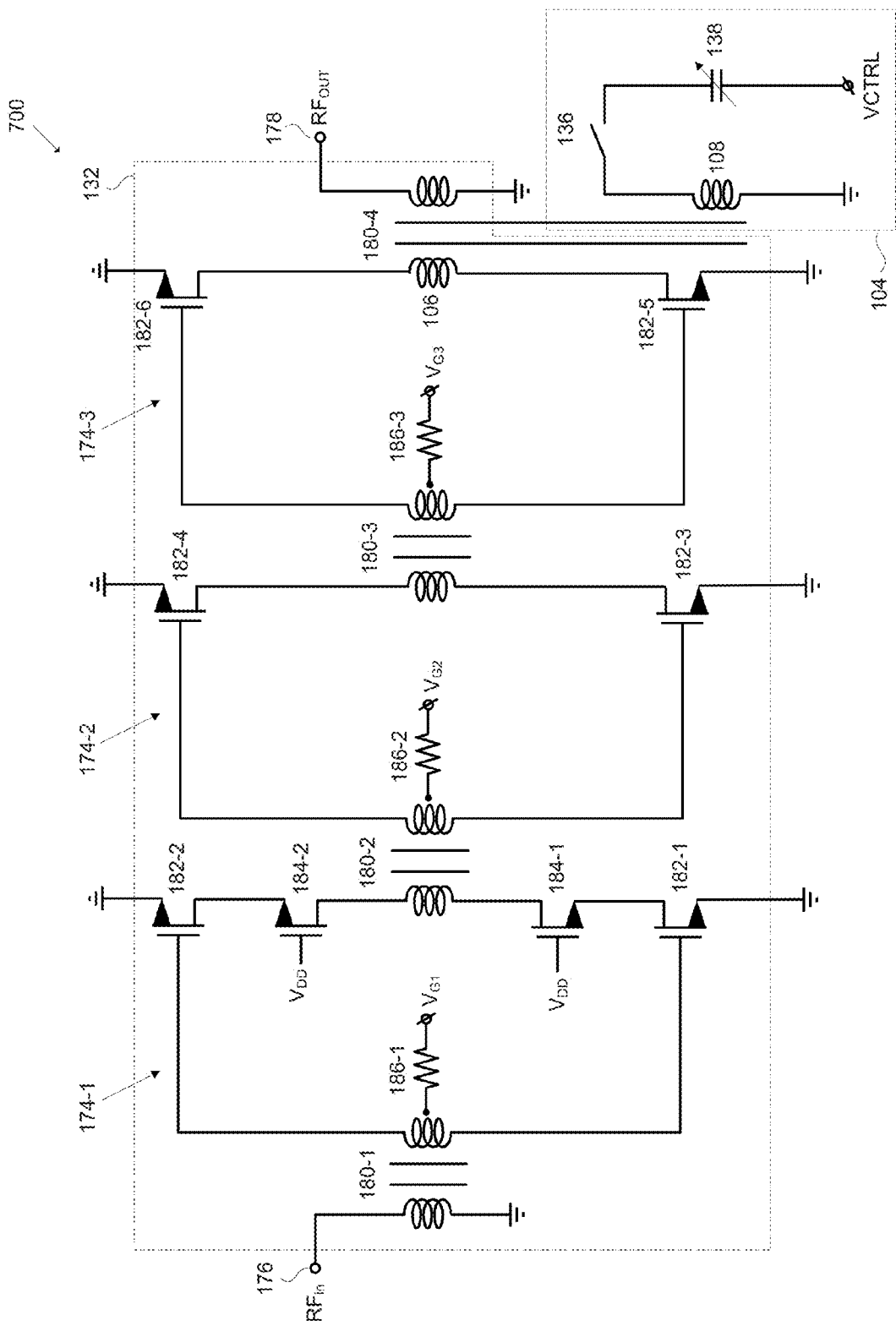
FIG. 7 is a schematic of another example of an integrated circuit that was designed and simulated.

FIG. 7 illustrates another of example of an IC 700 that was designed and simulated. IC 700 includes a power amplifier 132 that is inductively coupled to a calibration circuit 104. Power amplifier 132 includes three stages 174-1, 174-2, and 174-3 ("stages 174") that are coupled together and to the input and output nodes, 176, 178 by transformers 180-1, 180-2, and 180-3.

Stage 174-1 includes a first and second common source transistors 182-1, 182-2. Common source transistor has its gate coupled to transformer 180-1 and its drain coupled to the source of transistor 184-1. Transistor 184-1 has its gate coupled to $V_{DD}$ and its drain coupled to transformer 180-2. Common source transistor 182-2 has its gate coupled to transformer 180-1 and its drain coupled to transistor 184-2, which has its gate coupled to $V_{DD}$ and its drain coupled to transformer 180-2. Transformer 180-1 may include a center tap coupled to bias voltage VG1 through resistor 186-1.

Transformer 180-2 couples the first stage 174-1 to the second stage 174-2. The second stage 174-2 includes a first common source transistor 182-3 having its gate coupled to transformer 180-2 and its drain coupled to transformer 180-3. A second common source transistor 182-4 has its gate coupled to transformer 180-2 and its drain coupled to transformer 180-3. A bias resistor 186-2 is coupled to a central tap of transformer 186-2 and to a bias voltage $V_{G2}$.

The second stage 174-2 is coupled to the third stage 174-3 by transformer 180-3, which has a central tap coupled to a bias voltage $V_{G3}$ through resistor 186-3. Stage 174-3 includes first and second common source transistors 182-5, 182-6 each having their respective gates coupled to transformer 180-3. Transistor 182-5 has its drain coupled to transformer 180-4, and transistor 182-6 has its drain coupled to transformer 180-4.

Output node 178 of power amplifier 132 is coupled to a coil of transformer 180-4 and configured to output an output signal, RFout. Calibration circuit 104 is coupled to coil 106 of power amplifier 132 through coil 108, which is coupled to ground and to switch 136. Switch 136 is configured to selectively couple varactor 138 to inductor 108 to adjust the inductive load to power amplifier 132 based on the control voltage VCTRL.

Figure 8A:
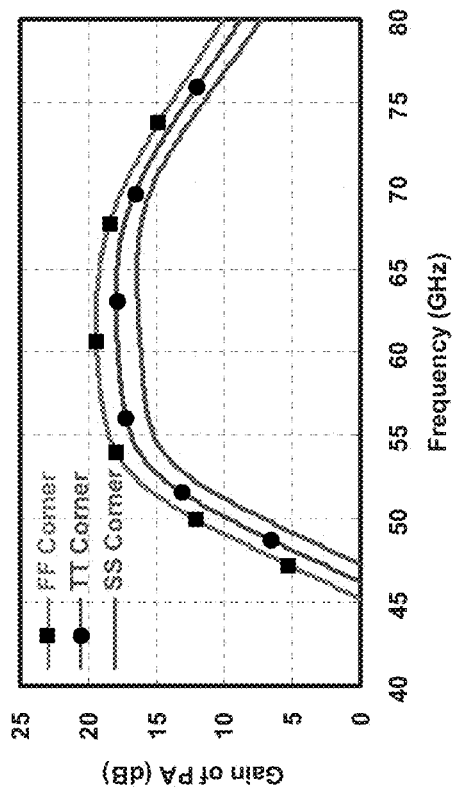
FIG. 8A is a gain versus frequency graph of an uncalibrated RF circuit in accordance with FIG. 7 for different process corners.

FIG. 8A is a gain versus frequency graph of a three-stage power amplifier, which has not been calibrated using a calibration circuit that is inductively coupled to the power amplifier, over different processing corners. As shown in FIG. 8A, the gain of the LNA may vary by approximately 4 dB between the FF corner and the SS corner for frequencies greater than 60 GHz. The gain in the TT corner is between the FF and SS corners.

Figure 8B:
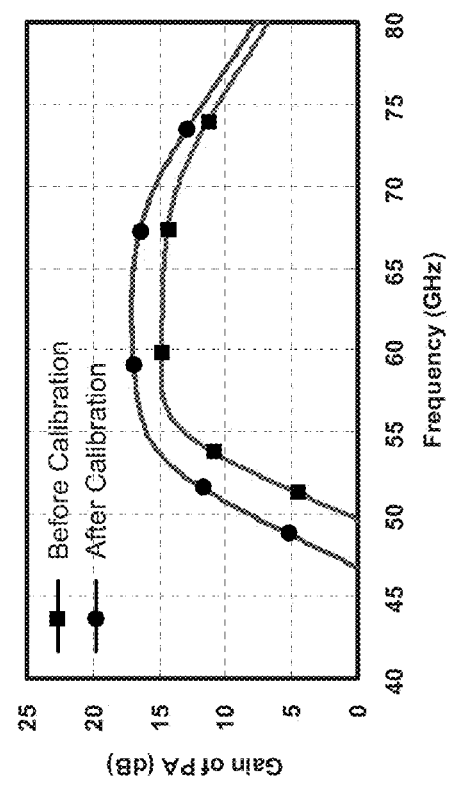
FIG. 8B is a gain versus frequency graph of a calibrated and uncalibrated RF circuit in accordance with FIG. 7.

FIG. 8B is also a gain versus frequency graph for a three-stage power amplifier, but compares the gain of the power amplifier prior to calibration to the gain of the power amplifier after calibration. As shown in FIG. 8B, the maximum gain of the power amplifier may be correlated under process variations. The simulation data in FIGS. 8A and 8B were obtained by simulating IC 700 illustrated in FIG. 7 in which transistors 182-1 and 182-2 had widths of 40 μm and lengths of 60 nm, transistors 184-1 and 184-2 had widths of 75 μm and lengths of 60 nm, transistors 182-5 and 182-6 had widths of 75 μm and lengths of 60 nm, and transformers 180-1, 180-2, 180-3, and 180-4 were single turn stacked transformers.

The disclosed calibration circuit and method advantageously calibrate a high frequency RF circuit through inductive coupling. The use of inductive coupling from one chip to another chip of a 2.5D or 3D IC reduces parasitic capacitances that would otherwise degrade the performance of the RF circuit. In addition, by using contactless communication for transmitting the calibration signals between dies, the designer can potentially avoid addition of any signal through substrate vias (TSV) or power TSV that would otherwise be used to transmit the calibration signals.

In some embodiments, an integrated circuit includes a first chip and a second chip coupled to the first chip in a vertical stack. The first chip includes a radio frequency circuit and a first coil electrically coupled to the radio frequency circuit. The second chip includes a calibration circuit and a second coil electrically coupled to the calibration circuit. The calibration circuit is configured to calibrate the radio frequency circuit disposed on the first chip through inductive coupling between the first and second coils.

In some embodiments, a method includes electrically coupling a varactor of a calibration circuit disposed on a first chip to a first coil disposed on the first chip. A performance of an RF circuit that is inductively coupled to the calibration circuit is adjusted by varying at least one parameter of the calibration circuit. The RF circuit is disposed on a second chip of a vertical stack of chips that includes at least the first and second chips. A value of the at least one parameter of the calibration circuit is stored in a memory.

In some embodiments, an integrated circuit includes a radio frequency circuit formed in a first chip of a vertical stack of chips. A first coil formed in or on the first chip is electrically coupled to the radio frequency circuit. A calibration circuit is formed in a second chip of a vertical stack of chips. A second coil formed in or on the second chip is electrically coupled to the calibration circuit. The calibration circuit is configured to calibrate the radio frequency circuit disposed on the first chip through inductive coupling between the first and second coils.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An integrated circuit, comprising:
   a first chip including
      a first coil, and
      an amplifier electrically coupled to the first coil, the amplifier including
         a first transistor having a gate and a drain, the gate of the first transistor configured to receive an input signal, and the drain of the first transistor coupled to a first voltage supply, and
         a second transistor having a source and a drain, the drain of the second transistor coupled to a source of the first transistor, and the source of the second transistor coupled to a second power supply through the first coil; and
   a second chip coupled to the first chip in a vertical stack, the second chip including
      a calibration circuit, and
      a second coil electrically coupled to the calibration circuit,
   wherein the calibration circuit is configured to calibrate the radio frequency circuit disposed on the first chip through inductive coupling between the first and second coils.

2. The integrated circuit of claim 1, wherein the calibration circuit includes a varactor coupled to a voltage source and to the second coil.

3. The integrated circuit of claim 2, wherein a switch is coupled between the varactor and the second coil.

4. The integrated circuit of claim 3, wherein the switch includes one of a transistor or a microelectromechanical system switch.

5. The integrated circuit of claim 2, wherein the voltage source is a direct current voltage source configured to supply a range of direct current voltages.

6. The integrated circuit of claim 1, wherein the calibration circuit includes a plurality of varactors coupled in parallel with each other, each of the plurality of varactors coupled to the second coil and to a respective voltage source.

7. The integrated circuit of claim 6, wherein each of the plurality of varactors is coupled to the second coil through a respective switch.

8. The integrated circuit of claim 7, wherein the switches include one of a transistor or a microelectromechanical system switch.

9. A method, comprising:
   varying at least one parameter of a calibration circuit that is formed on a first chip of a vertical stack of chips and is electrically coupled to a first coil disposed on the first chip; and
   adjusting amplifier that is inductively coupled to the calibration circuit via a second coil that is disposed on a second chip of the vertical stack of chips in response to the varying of the at least one parameter of the calibration circuit, the amplifier including a first transistor having a gate and a drain, the gate of the first transistor configured to receive an input signal, and the drain of the first transistor coupled to a first voltage supply, and a second transistor having a source and a drain, the drain of the second transistor coupled to a source of the first transistor, and the source of the second transistor coupled to a second power supply through the second coil.

10. The method of claim 9, wherein varying the at least one parameter of the calibration circuit includes varying an inductance of the calibration circuit.

11. The method of claim 10, wherein varying the inductance of the calibration circuit includes varying a voltage provided to a varactor that is coupled to the first coil.

12. The method of claim 10, wherein varying the inductance of the calibration circuit includes selectively coupling one of a plurality of varactors to the first coil, each of the plurality of varactors provided with a different voltage level.

13. The method of claim 9, further comprising:
providing the radio frequency circuit with an oscillating input voltage;
measuring an output of the radio frequency circuit as the at least one parameter is varied; and
selecting the value of the at least one parameter of the calibration circuit based on the output of the radio frequency circuit.

14. The method of claim 9, wherein the varying of the at least one parameter includes electrically coupling a varactor of the calibration circuit to the first coil.

15. An integrated circuit, comprising:
a first coil on or in a first chip of a vertical stack of chips;
an amplifier electrically coupled to the first coil, the amplifier including a first transistor having a gate and a drain, the gate of the first transistor configured to receive an input signal, and the drain of the first transistor coupled to a first voltage supply, and a second transistor having a source and a drain, the drain of the second transistor coupled to a source of the first transistor, and the source of the second transistor coupled to a second power supply through the first coil;

a calibration circuit formed in a second chip of the vertical stack of chips; and a second coil on or in the second chip, the second coil electrically coupled to the calibration circuit, wherein the calibration circuit is configured to calibrate the radio frequency circuit disposed on the first chip through inductive coupling between the first and second coils.

16. The integrated circuit of claim 15, wherein the calibration circuit includes a varactor coupled to a voltage source and to the second coil.

17. The integrated circuit of claim 16, wherein a switch is coupled between the varactor and the second coil.

18. The integrated circuit of claim 15, wherein the radio frequency circuit is a low noise amplifier of a receiver.

19. The integrated circuit of claim 15, wherein the radio frequency circuit is a power amplifier of a transmitter.

20. The integrated circuit of claim 15, wherein the calibration circuit includes a plurality of varactors coupled in parallel with each other, each of the plurality of varactors coupled to the second coil and to a respective voltage source.

21. The integrated circuit of claim 20, wherein each of the plurality of varactors is coupled to the second coil through a respective switch.

* * * * *